(12) United States Patent
Banerjee et al.

(10) Patent No.: US 10,553,286 B2
(45) Date of Patent: Feb. 4, 2020

(54) TAILORING TIMING OFFSETS DURING A PROGRAMMING PULSE FOR A MEMORY DEVICE

(71) Applicant: Intel Corporation, Santa Clara, CA (US)

(72) Inventors: Koushik Banerjee, Milpitas, CA (US); Daniel Chu, Folsom, CA (US); Shravya Gottipati, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/147,422

(22) Filed: Sep. 28, 2018

(65) Prior Publication Data

US 2019/0043585 A1     Feb. 7, 2019

(51) Int. Cl.
| | | |
|---|---|---|
| *G11C 16/04* | (2006.01) | |
| *G11C 16/10* | (2006.01) | |
| *G11C 16/34* | (2006.01) | |
| *G11C 16/32* | (2006.01) | |

(52) U.S. Cl.
CPC .......... *G11C 16/10* (2013.01); *G11C 16/0433* (2013.01); *G11C 16/32* (2013.01); *G11C 16/3427* (2013.01)

(58) Field of Classification Search
CPC ..... G11C 16/10; G11C 16/0433; G11C 16/32; G11C 16/3427
USPC ..................................................... 365/185.02
See application file for complete search history.

(56) References Cited

U.S. PATENT DOCUMENTS

2014/0104955 A1\* 4/2014 Kwak ............... G11C 16/0483
365/185.19

\* cited by examiner

*Primary Examiner* — Huan Hoang
(74) *Attorney, Agent, or Firm* — Thorpe North & Western, LLP; David W. Osbome

(57) ABSTRACT

Technology for a memory device is described. The memory device can include an array of memory cells and a memory controller. The memory controller can receive a request to program a memory cell within the array of memory cells. The memory controller can select one or more timing offsets for a programming pulse based on one or more of a polarity of access for the memory cell, a number of prior write cycles for the memory cell, or electrical distances between the memory cell and wordline/bitline decoders within the array of memory cells. The memory controller can initiate, in response to the request, the programming pulse with the one or more selected timing offset to program the memory cell within the array of memory cells.

28 Claims, 8 Drawing Sheets

TAILORING TIMING OFFSETS DURING A PROGRAMMING PULSE FOR A MEMORY DEVICE

BACKGROUND

Memory devices are typically provided as internal, semiconductor, integrated circuits in computers or other electronic devices. There are many different types of memory including volatile memory, for example, dynamic random access memory (DRAM), synchronous dynamic random access memory (SDRAM), and non-volatile memory, for example, flash memory.

Flash memory devices typically use a one-transistor memory cell that allows for high memory densities, high reliability, and low power consumption. Changes in threshold voltage of the cells, through programming of a charge storage node (e.g., a floating gate or charge trap) determine the data state of each cell. Other non-volatile memories such as phase change (PRAM) use other physical phenomena such as a physical material change or polarization to determine the data state of each cell. Common uses for flash and other solid state memories include personal computers, personal digital assistants (PDAs), digital cameras, digital media players, digital recorders, games, appliances, vehicles, wireless devices, cellular telephones, and removable portable memory modules among others.

BRIEF DESCRIPTION OF THE DRAWINGS

Features and advantages of technology embodiments will be apparent from the detailed description which follows, taken in conjunction with the accompanying drawings, which together illustrate, by way of example, various technology features; and, wherein.

Figure 1:
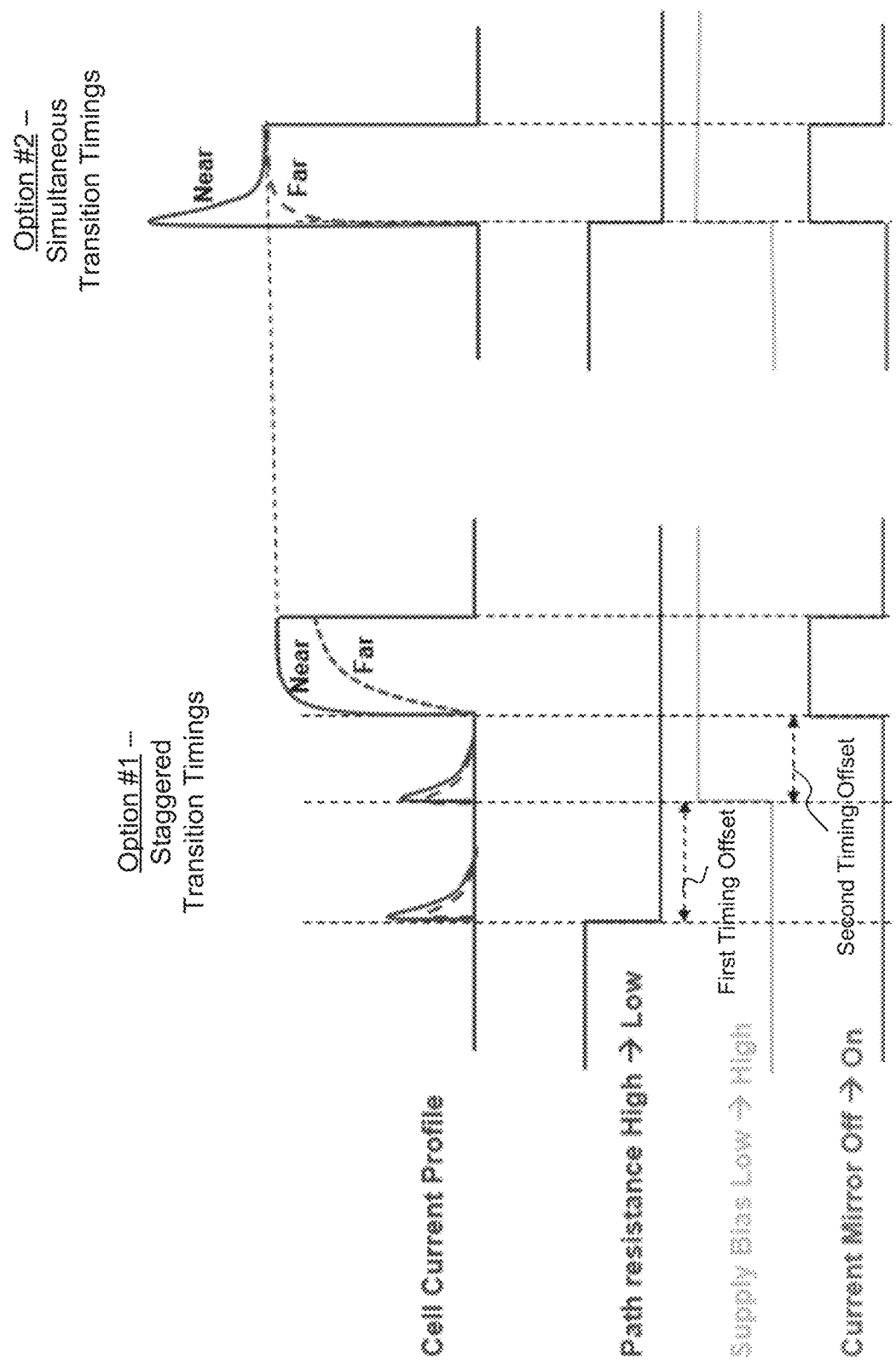
FIG. 1 illustrates staggered transition timings versus simultaneous transition timings during a programming pulse for a memory device in accordance with an example embodiment.

Reference will now be made to the exemplary embodiments illustrated, and specific language will be used herein to describe the same. It will nevertheless be understood that no limitation on technology scope is thereby intended.

DESCRIPTION OF EMBODIMENTS

Before the disclosed invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various invention embodiments. One skilled in the relevant art will recognize, however, that such detailed embodiments do not limit the overall technological concepts articulated herein, but are merely representative thereof.

As used in this written description, the singular forms "a," "an" and "the" include express support for plural referents unless the context clearly dictates otherwise. Thus, for example, reference to "a bit line" includes a plurality of such bit lines.

Reference throughout this specification to "an example" means that a particular feature, structure, or characteristic described in connection with the example is included in at least one embodiment of the present invention. Thus, appearances of the phrases "in an example" or "an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," "maximized," "minimized," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

An initial overview of technology embodiments is provided below and then specific technology embodiments are described in further detail later. This initial summary is intended to aid readers in understanding the technology more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

A memory device or memory system can utilize non-volatile memory (NVM). NVM is a storage medium that does not require power to maintain the state of data stored by the medium. NVM has traditionally been used for the task of data storage, or long-term persistent storage, but new and evolving memory technologies allow the use of NVM in roles that extend beyond traditional data storage. One example of such a role is the use of NVM as main or system memory. Non-volatile system memory (NVMsys) can combine data reliability of traditional storage with ultra-low latency and high bandwidth performance, having many advantages over traditional volatile memory, such as high density, large capacity, lower power consumption, and reduced manufacturing complexity, to name a few. Byte-addressable, write-in-place NVM such as three-dimensional (3D) cross-point memory, for example, can operate as byte-addressable memory similar to dynamic random-access memory (DRAM), or as block-addressable memory similar to NAND flash. In other words, such NVM can operate as system memory or as persistent storage memory (NVMstor). In some situations where NVM is functioning as system memory, stored data can be discarded or otherwise rendered unreadable when power to the NVMsys is interrupted. NVMsys also allows increased flexibility in data management by providing non-volatile, low-latency memory that can be located closer to a processor in a computing device. In some examples, NVMsys can reside on a DRAM bus, such that the NVMsys can provide ultra-fast DRAM-like access to data. NVMsys can also be useful in computing environments that frequently access large, complex data sets, and environments that are sensitive to downtime caused by power failures or system crashes.

Non-limiting examples of NVM can include planar or three-dimensional (3D) NAND flash memory, including single or multi-threshold-level NAND flash memory, NOR flash memory, single or multi-level Phase Change Memory (PCM), such as chalcogenide glass PCM, planar or 3D PCM, cross-point array memory, including 3D cross-point memory, non-volatile dual in-line memory module (NVDIMM)-based memory, such as flash-based (NVDIMM-F) memory, flash/DRAM-based (NVDIMM-N) memory, persistent memory-based (NVDIMM-P) memory, 3D cross-point-based NVDIMM memory, resistive RAM (ReRAM), including metal-oxide- or oxygen vacancy-based ReRAM, such as HfO2-, Hf/HfOx-, Ti/HfO2-, TiOx-, and TaOx-based ReRAM, filament-based ReRAM, such as Ag/GeS2-, ZrTe/Al2O3-, and Ag-based ReRAM, programmable metallization cell (PMC) memory, such as conductive-bridging RAM (CBRAM), silicon-oxide-nitride-oxide-silicon (SONOS) memory, ferroelectric RAM (FeRAM), ferroelectric transistor RAM (Fe-TRAM), anti-ferroelectric memory, polymer memory (e.g., ferroelectric polymer memory), magnetoresistive RAM (MRAM), write-in-place non-volatile MRAM (NVMRAM), spin-transfer torque (STT) memory, spin-orbit torque (SOT) memory, nanowire memory, electrically erasable programmable read-only memory (EEPROM), nanotube RAM (NRAM), other memristor- and thyristor-based memory, spintronic magnetic junction-based memory, magnetic tunneling junction (MTJ)-based memory, domain wall (DW)-based memory, and the like, including combinations thereof. The term "memory device" can refer to the die itself and/or to a packaged memory product. NVM can be byte or block addressable. In some examples, NVM can comply with one or more standards promulgated by the Joint Electron Device Engineering Council (JEDEC), such as JESD21-C, JESD218, JESD219, JESD220-1, JESD223B, JESD223-1, or other suitable standard (the JEDEC standards cited herein are available at www.jedec.org). In one specific example, the NVM can be 3D cross-point memory. In another specific example, the memory can be NAND or 3D NAND memory. In another specific example, the system memory can be STT memory.

The present technology describes a high current programming pulse transient optimization when performing a program operation (or write operation) for a memory cell in a memory device based on a polarity of access of the memory cell, a number of prior write cycles for the memory cell and/or a decoder distance (e.g., electrical distances between the memory cell and wordline/bitline decoders within an array of memory cells). The array of memory cells can include a plurality of wordlines and a plurality of bitlines. The high current programming pulse can be delivered to the memory cell based on a combination of various signals, such as a first signal that corresponds to a path resistance for the memory cell transitioning from high to low, a second signal that corresponds to a voltage bias that is supplied to the memory cell transitioning from low to high, and a third signal that corresponds to a current mirror transitioning from off to on. The current mirror can be an electronic circuit that copies a current through one active device by controlling a current in another active device, thereby keeping a constant output current irrespective of loading. A relative timing of these signals (i.e., timing offsets between the signals) can impact a current transient differently depending on memory cell location(s) within the array of memory cells, and an impact of the current transient on a memory cell performance can be different depending on the polarity of access of the memory cell(s) and the number of prior write cycles for the memory cell(s). Therefore, in the present technology, rather than using the same fixed transition timing offsets for the signals during high current programming pulse delivery, timing offsets for the signals corresponding to the path resistance, the voltage bias and the current mirror can be adjusted as a function of the polarity of access of the memory cell being programmed, the number of prior write cycles for the memory cell being programmed and/or the decoder distance for the memory cell being programmed.

In one example, the timing offsets for the signals corresponding to the path resistance, the voltage bias and the current mirror can be adjusted based on the polarity of access because a write disturb risk versus a programmability risk trade-off can vary depending on the polarity of access. The write disturb risk can refer to a level of risk that an error occurs when one or more bits not intended to be programmed are changed during the program operation, whereas the programmability risk can refer to a level of risk that a memory cell is incorrectly programmed. In another example, the timing offsets for the signals corresponding to the path resistance, the voltage bias and the current mirror can be adjusted based on the number of prior write cycles because the write disturb risk versus the programmability risk trade-off can depend on the number of prior write cycles. In yet another example, the timing offsets for the signals corresponding to the path resistance, the voltage bias and the current mirror can be adjusted based on the decoder distance to optimize the write disturb risk for near memory cells versus the programmability risk for far memory cells. The memory cells can be located relatively "near" or "far" in relation to the decoder (or supply).

In past solutions, the same fixed transition timing offsets were used for the signals corresponding to the path resistance, the voltage bias and the current mirror during high current programming pulse delivery for all memory cells in the array of memory cells over a period of time (or through cycling), which would not optimize the write disturb risk, the programmability risk and energy consumption of the memory cells in different parts of the array of memory cells through write cycle endurance. The past solutions would use the same fixed transition timing offsets for the signals corresponding to the path resistance, the voltage bias and the current mirror to mitigate a worst-case scenario, which corresponded to a write disturb reliability issue for positive polarity (or forward polarity) memory cells located near the decoders at time-0. In other words, in the past solutions, only one specific transient profile could be selected for the high current programming pulse, which would optimize performance for only memory cells in a specific location in the array of memory cells at time-0. In addition, the past solutions did not optimize the transient for all parts of the array of memory cells, which would result in increased energy consumption and functionality risk for far memory cells and/or negative polarity (or reverse polarity) memory cells with additional risk post cycling.

In the present technology, by using adjustable or variable timing offsets for the signals corresponding to the path resistance, the voltage bias and the current mirror, a high current programming pulse performance can be improved at multiple locations within the array of memory cells by: reducing the write disturb risk at near memory cells, reducing the programmability risk at far memory cells, optimizing based on the polarity of access since risk magnitudes vary depending on the polarity, and optimizing based on the number of prior write cycles (or write cycling) since the write disturb risk and the programmability risk exhibit a trade-off depending on the number of prior write cycles. In addition, the adjustable or variable timing offsets can result in improved net energy consumption when programming the memory cell(s).

In the present technology, rather than using the same fixed transition timing offsets during high current programming pulse delivery, the timing offset(s) for the signals corresponding to the path resistance, the voltage bias and the current mirror can be adjusted according. For example, optimal transition timing offset(s) can be used to minimize a transient current overshoot at near memory cells at time-0, where the optimal transition timing offset(s) can depend on the write disturb risk by polarity (positive polarity or negative polarity). Further, zero/minimal transition timing offset(s) can be used at far memory cells, for both positive polarity and negative polarity, through cycling since the far memory cells have no/minimal write disturb risk but higher programmability risk. Further, the transition timing offset(s) can be skewed between the transition timing offset(s) for near memory cells and the transition timing offset(s) for far memory cells, depending on the decoder distance at a given polarity (positive polarity or negative polarity). In addition, the transition timing offset(s) can be reduced at near memory cells with an increasing number of prior write cycles, depending on a write disturb risk reduction versus a programmability risk increase through cycling.

In one example, the timing offsets for the signals corresponding to the path resistance, the voltage bias and the current mirror can be adjusted based on the polarity of access for the memory cell(s). In a stack array structure, memory cells can have a positive polarity of access or a negative polarity of access. The positive polarity of access can correspond to an electrical connection where current flows from a programmable memory (PM) to a select device (SD) within a memory cell stack, whereas a negative polarity of access can correspond to an electrical connection where current flows from an SD to a PM within a memory cell stack. As an example, in a stack array structure having a two-deck configuration that shares a same bitline with a positive voltage supply, a lower deck can have a positive polarity of access and an upper deck can have a negative polarity of access. Since the polarity of access can impact the write disturb risk and the programmability risk when programming the memory cell(s), the polarity of access can be accounted for when adjusting the timing offsets for the signals corresponding to the path resistance, the voltage bias and the current mirror.

In one example, the timing offsets for the signals corresponding to the path resistance, the voltage bias and the current mirror can be adjusted based on the number of prior write cycles for the memory cell(s). Generally, a memory device can distribute a write cycle relatively evenly across memory cells in an entire array, such that the memory cells have a relatively same write cycle count. The distribution of the write cycles can be maintained by a controller in the memory device. For example, the controller can maintain a counter to track the number of write cycles for the memory cells. However, since the number of prior write cycles can impact the write disturb risk and the programmability risk when programming the memory cell(s), the number of prior write cycles can be accounted for when adjusting the timing offsets for the signals corresponding to the path resistance, the voltage bias and the current mirror.

In one example, the timing offsets for the signals corresponding to the path resistance, the voltage bias and the current mirror can be adjusted based on the decoder distance for the memory cell(s). Generally, for a two-dimensional array of memory cells, electrical voltages can be applied to write to a memory cell using wires that connect to the memory cell. The array can include a decoder that is connected via a metal line. The electrical power that is provided from the decoder over the metal line can depend on a distance (e.g., a relatively near or far distance) from a voltage source. In the two-dimensional array, there can be some memory cells that are located near to the decoder, which can serve as a power source, while there can be some memory cells that are located far from the decoder. A far memory cell can receive a reduced bias due to resistance in the metal line. On the other hand, a near memory cell may not experience the reduced bias due to reduced resistance in the metal line. In other words, a near memory cell can behave differently than a far memory cell. As a result, the write disturb risk and the programmability risk can be different for near memory cells versus far memory cells when programming the memory cell(s). Thus, decoder distance can be accounted for when adjusting the timing offsets for the signals corresponding to the path resistance, the voltage bias and the current mirror.

FIG. 1 illustrates an example of staggered transition timings versus simultaneous transition timings during a programming pulse for a memory device. The transition timings can refer to timing offsets between multiple signals that occur during a high current programming pulse to program a memory cell. In other words, the high current programming pulse to program the memory cell may not be one signal, but rather can be a combination of multiple signals. The multiple signals can include a first signal that corresponds to a path resistance for the memory cell transitioning from high to low, a second signal that corresponds to a voltage bias that is supplied to the memory cell transitioning from low to high, and a third signal that corresponds to a current mirror transitioning from off to on. The high current programming pulse can be performed when all three signals corresponding to the path resistance, the voltage bias and the current mirror are applied to program the memory cell.

In one example, as shown in FIG. 1, the transition timings can be staggered, such that the first signal for the path resistance occurs, the second signal for the supply bias occurs, and then the third signal for the current mirror occurs (in that order). A first timing offset can separate the first signal for the path resistance and the second signal for the supply bias, and a second timing offset can separate the second signal for the supply bias and the third signal for the current mirror. In this example, an advantage of the staggered transition timings can be that a write disturb risk can be reduced for near memory cells, since an amount of current provided to these near memory cells can be increased, as indicated in the memory cell current profile. However, a disadvantage of the staggered transition timings can be that a programmability risk can be increased for far memory cells, since an amount of current provided to these far memory cells can be reduced, as indicated in the memory cell current profile. Another disadvantage of the staggered transition timings can be higher energy consumption due to multiple charge/discharge of internal capacitors in the memory device.

In another example, as shown in FIG. 1, the transition timings can be simultaneous, such that the first signal for the path resistance, the second signal for the supply bias, and the third signal for the current mirror occur at a same time. In this example, an advantage of the simultaneous transition timings can be that a programmability risk can be reduced for far memory cells, since an amount of current provided to these far memory cells can be increased, as indicated in the memory cell current profile. Another advantage of the simultaneous transition timings can be reduced energy consumption due to minimal charge/discharge of internal capacitors in the memory device. However, a disadvantage of the simultaneous transition timings can be that a write disturb risk can be increased for near memory cells, since an amount of current provided to these near memory cells can be reduced, as indicated in the memory cell current profile.

In one example, the first signal for the path resistance, the second signal for the supply bias, and the third signal for the current mirror can each be applied for a very small period of time, and there can be a transient current that flows through the memory cell from each of these three signals. Even though the current mirror can theoretically control the current, during each of these transitions, there can be a small amount of current that flows through the memory cell due to different capacitances charging or discharging in the memory cell.

In one example, the array of memory cells can be relatively large, so some memory cells can be located near to a decoder (or supply), whereas other memory cells can be located far to the decoder. As a result, the near memory cells can have a different resistance path as compared to the far memory cells, and an effective bias applied on the memory cells can be different for different locations of the array of memory cells. In past solutions, the same transition timings offsets would be commonly applied for all memory cells in the array of memory cells. In past solutions, when a programming pulse sequence with the staggered transition timings was applied, the effective pulse seen by each memory cell can vary depending on its location within the array of memory cells. For example, the near memory cells would receive a suitable current pulse, whereas the far memory cells would receive a lower current pulse. Furthermore, when a programming pulse sequence with the simultaneous transition timings was applied, each of the signals would add up and overshoot, such that the near memory cells would receive a higher current pulse but the far memory cells would receive a suitable current pulse. Therefore, in the past solutions, due to the same transition timing offsets being commonly applied for all memory cells in the array irrespective of memory cell location within the array, only one of the near memory cells or the far memory cells would receive a suitable amount of current from the decoder.

In the present technology, a programming pulse can be initiated with timing offsets that are selected based on a polarity of access, a number of prior write cycles and a decoder distance. The program pulse can be applied by a memory controller in a memory device to program memory cell(s) in an array of memory cells in the memory device. The memory controller can receive a request to program a memory cell within the array of memory cells. The memory controller can select or adjust one or more timing offsets (i.e., the timing offsets can be variable) for the programming pulse based on the polarity of access for the memory cell, the number of prior write cycles for the memory cell and/or the decoder distance (e.g., electrical distances between the memory cell and wordline/bitline decoders within an array of memory cells). The memory controller can initiate, in response to the request, the programming pulse with the one or more selected timing offsets to program the memory cell within the array of memory cells. The memory controller can reduce a likelihood of program disturbs and reduce a programmability risk in multiple regions of the array of memory cells by selecting optimized timing offsets for programming pulses based on the polarity of access, the number of prior write cycles and/or the decoder distance.

In one configuration, the memory controller can select the one or more timing offsets between multiple signals of the programming pulse. The multiple signals of the programming pulse can include a first signal that corresponds to a path resistance for the memory cell transitioning from high to low, a second signal that corresponds to a voltage bias that is supplied to the memory cell transitioning from low to high, and a third signal that corresponds to a current mirror transitioning from off to on.

In one example, the one or more timing offsets can include a first timing offset between the first signal that corresponds to the path resistance and the second signal that corresponds to the voltage bias, and a second timing offset between the second signal that corresponds to the voltage bias and the third signal that corresponds to the current mirror. In one example, the second timing offset can be equal to zero when the second signal and the third signal occur at a same time. In other words, in this example, the first signal can occur first, and can be followed by the second signal and the third signal which occur at the same time.

In another example, the one or more timing offsets can include a first timing offset between the second signal that corresponds to the voltage bias and the first signal that corresponds to the path resistance, and a second timing offset between the first signal that corresponds to the path resistance and the third signal that corresponds to the current mirror. In one example, the second timing offset can be equal to zero when the first signal and the third signal occur at a same time. In other words, in this example, the second signal can occur first, and can be followed by the first signal and the third signal which occur at the same time.

In one example, the one or more timing offsets can be equal to zero when the first signal, the second signal and the third signal occur at a same time. In other words, in this example, the first signal that corresponds to the path resistance, the second signal that corresponds to the voltage bias, and the third signal that corresponds to the current mirror can all occur simultaneously, such that there is no timing offset between the first signal, the second signal and the third signal.

In one configuration, the memory controller can determine the polarity of access for the memory cell to be positive when a memory address of the memory cell is associated with a positive polarity deck. Alternatively, the memory controller can determine the polarity of access for the memory cell to be negative when the memory address of the memory cell is associated with a negative polarity deck. The memory controller can select the one or more timing offsets for the programming pulse in accordance with the polarity of access being positive or the polarity of access being negative. More specifically, the memory controller can select decreased timing offsets for the programming pulse when the polarity of access for the memory cell is negative or increased timing offsets when the polarity of access for the memory cell is positive.

In one example, the memory controller can determine the number of prior write cycles for the memory cell. The memory controller can select increased timing offsets or decreased timing offsets for the programming pulse depending on the number of prior write cycles for the memory cell. More specifically, the memory controller can select decreased timing offsets for the programming pulse when the number of prior write cycles for the memory cell is increased, or select increased timing offsets for the programming pulse when the number of prior write cycles for the memory cell is decreased.

In one configuration, the memory controller can determine the electrical distances between the memory cell and the wordline/bitline decoders within the array of memory cells. The memory controller can select the one or more timing offsets for the programming pulse in accordance with the electrical distances between the memory cell and the wordline/bitline decoders being less than a defined threshold or greater than a defined threshold. The memory cell can be a near memory cell when the electrical distances are less than the defined threshold, or the memory cell can be a far memory cell when the electrical distances are greater than the defined threshold. In a more specific example, the memory controller can select increased timing offsets for the programming pulse when the electrical distances between the memory cell and the wordline/bitline decoders are less than the defined threshold, indicating that the memory cell is located relatively near from the wordline/bitline decoders. In another more specific example, the memory controller can select decreased timing offsets for the programming pulse when the electrical distances between the memory cell and the wordline/bitline decoders are greater than the defined threshold, indicating that the memory cell is located relatively far from the wordline/bitline decoders. In other words, the memory controller can select increased timing offsets for the programming pulse for near memory cells and decreased timing offsets for the programming pulse for far memory cells.

Figure 2:
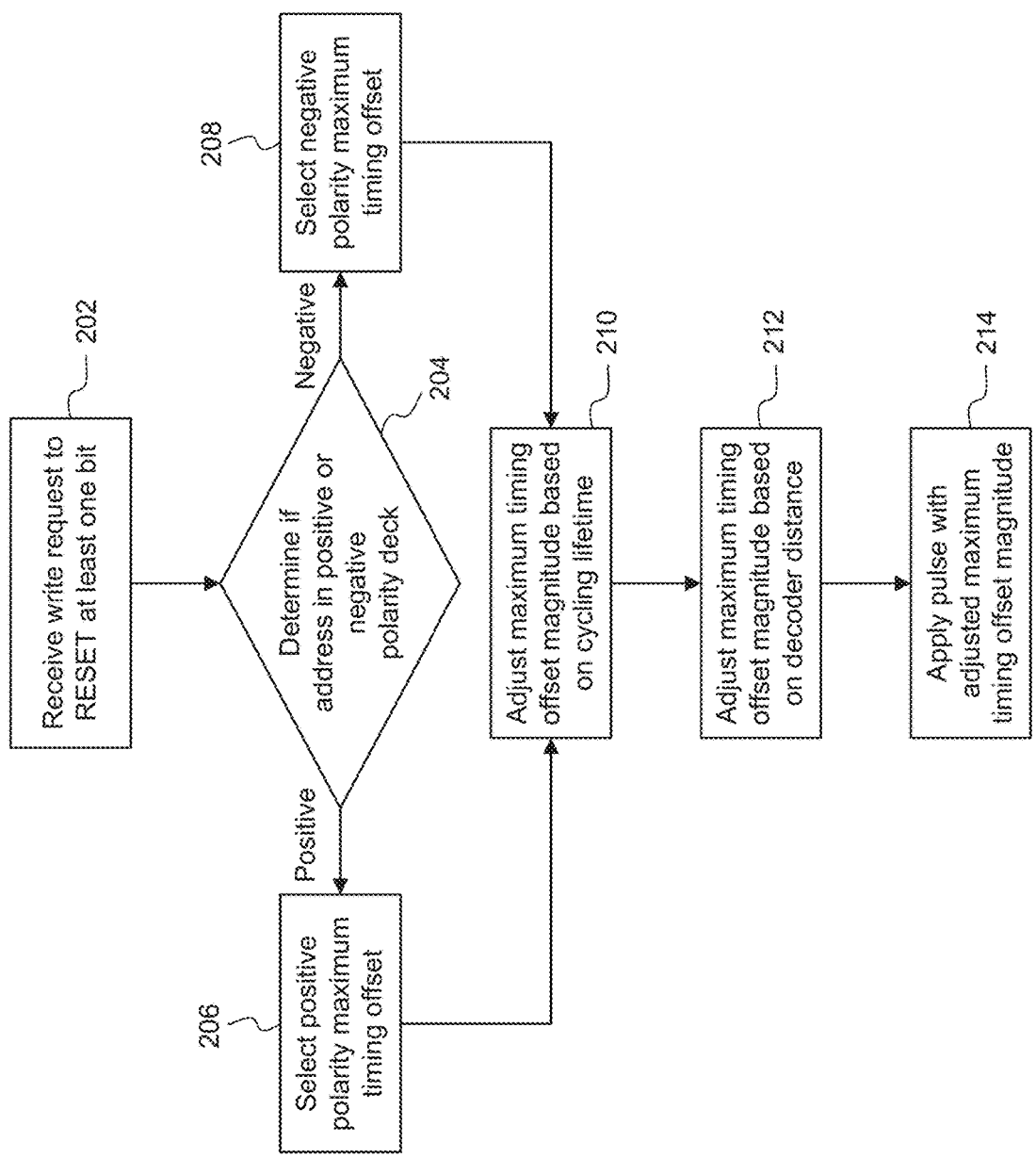
FIG. 2 illustrates a technique for initiating a programming pulse with timing offsets that are selected based on a polarity of access, a number of prior write cycles and electrical distances in accordance with an example embodiment.

FIG. 2 illustrates an exemplary technique for initiating a programming pulse with timing offsets that are selected based on a polarity of access, a number of prior write cycles and electrical distances. The programming pulse can be performed using a memory controller in a memory device. In step 202, the memory controller can receive a write request to reset at least one bit in a memory cell within an array of memory cells. In step 204, the memory controller can determine whether an address associated with the memory cell to be programmed is associated with a positive polarity of access (or positive polarity deck) or a negative polarity of access (or negative polarity deck). In step 206, when the memory address is associated with the positive polarity of access, the memory controller can select a positive polarity maximum timing offset. In step 208, when the memory address is associated with the negative polarity of access, the memory controller can select a negative polarity maximum timing offset. In step 210, the memory controller can adjust a maximum timing offset magnitude based on a number of prior write cycles (or cycling lifetime) for the memory cell. In step 212, the memory controller can adjust the maximum timing offset magnitude based on a decoder distance for the memory cell. Therefore, the maximum timing offset can be adjusted based on the polarity of access, the number of prior write cycles and the decoder distance. In step 214, the memory controller can apply a programming pulse having the adjusted maximum timing offset magnitude.

Figure 3:
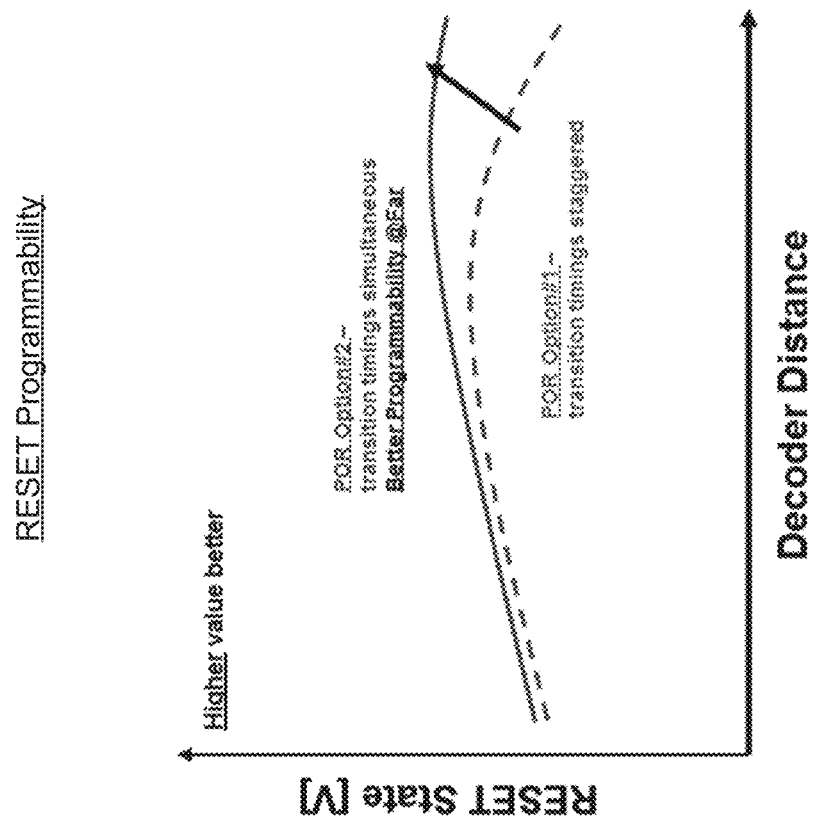
FIG. 3 illustrates a write disturb risk and a programmability risk trade-off with respect to decoder distance in accordance with an example embodiment.
Figure 3:
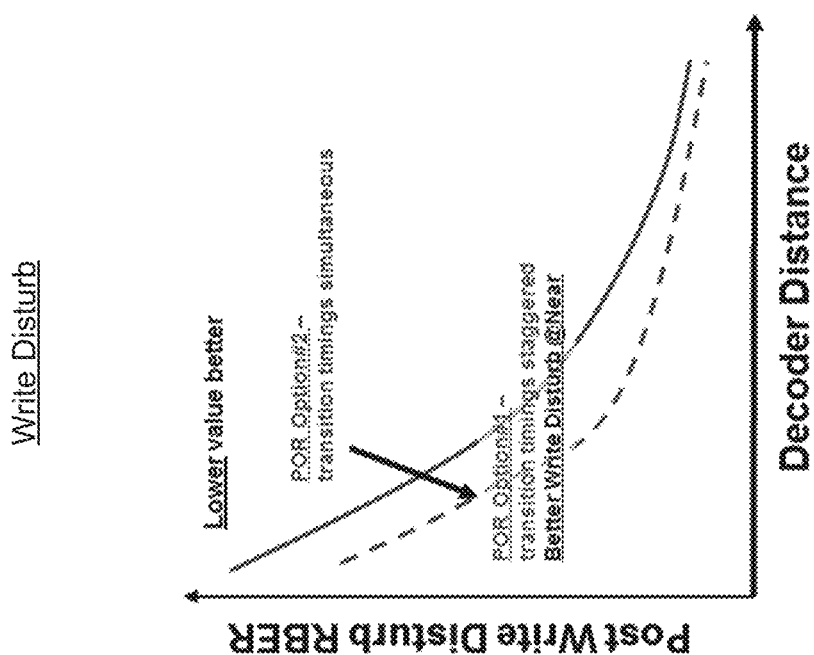

FIG. 3 illustrates an example of a write disturb risk and a programmability risk trade-off with respect to decoder distance. The write disturb risk and the programmability risk can be determined in relation to the decoder distance. As shown, in past solutions, staggered transition timings can result in an improved write disturb risk at near memory cells as compared to simultaneous transition timings. Further, as shown, in past solutions, simultaneous transition timings can result in an improved programmability risk at far memory cells as compared to staggered transition timings. In the past solutions, near memory cells would be optimized for the write disturb risk or far memory cells would be optimized for the programmability risk. However, in the present technology, by using variable or adjustable transition timings for signals corresponding to path resistance, supply bias and current mirror, the write disturb risk can be improved for the near memory cells and the programmability risk can be improved for the far memory cells.

Figure 4:
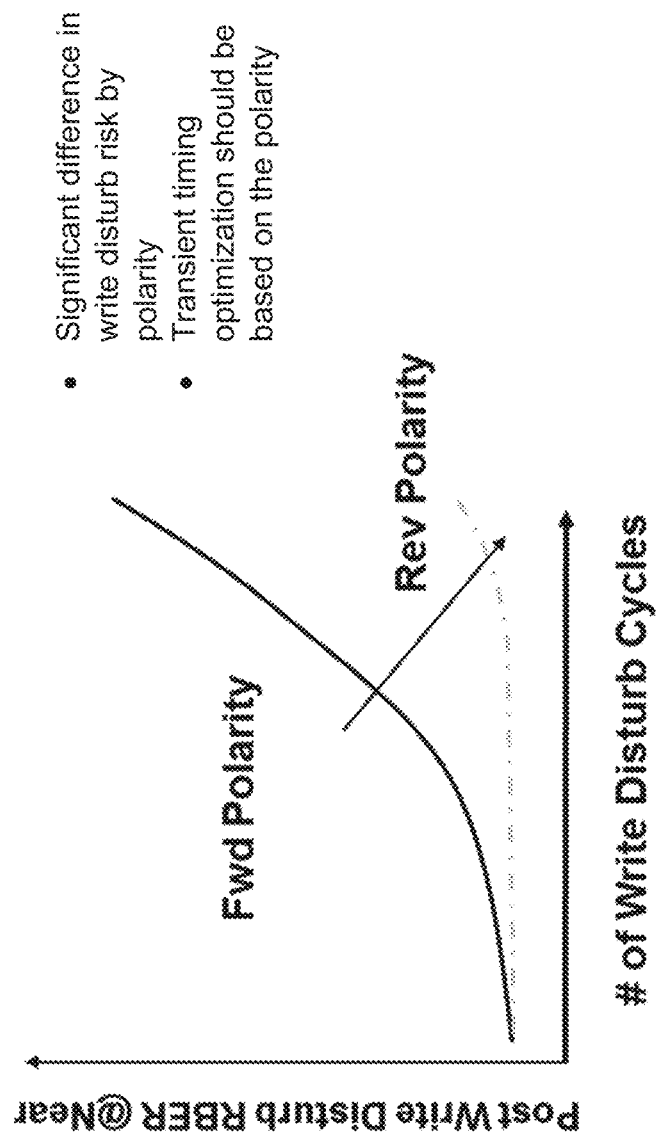
FIG. 4 illustrates a write disturb risk in relation to a polarity of access in accordance with an example embodiment.

FIG. 4 illustrates an example of a write disturb risk in relation to a polarity of access. The write disturb risk can be determined for staggered transition timings for both a positive polarity of access (or forward polarity) and a negative polarity of access (or negative polarity), and the write disturb risk can be determined for simultaneous transition timings for both a positive polarity of access (or forward polarity) and a negative polarity of access (or negative polarity). The write disturb risk can be determined in relation to a number of write disturb cycles. As shown, the write disturb risk can vary significantly depending on whether the polarity of access is positive or negative. Therefore, in the present technology, variable or adjustable transition timings can be determined for signals corresponding to path resistance, supply bias and current mirror (i.e., transient timing optimizations) based on whether the polarity of access for memory cell(s) being programmed is positive or negative.

Figure 5:
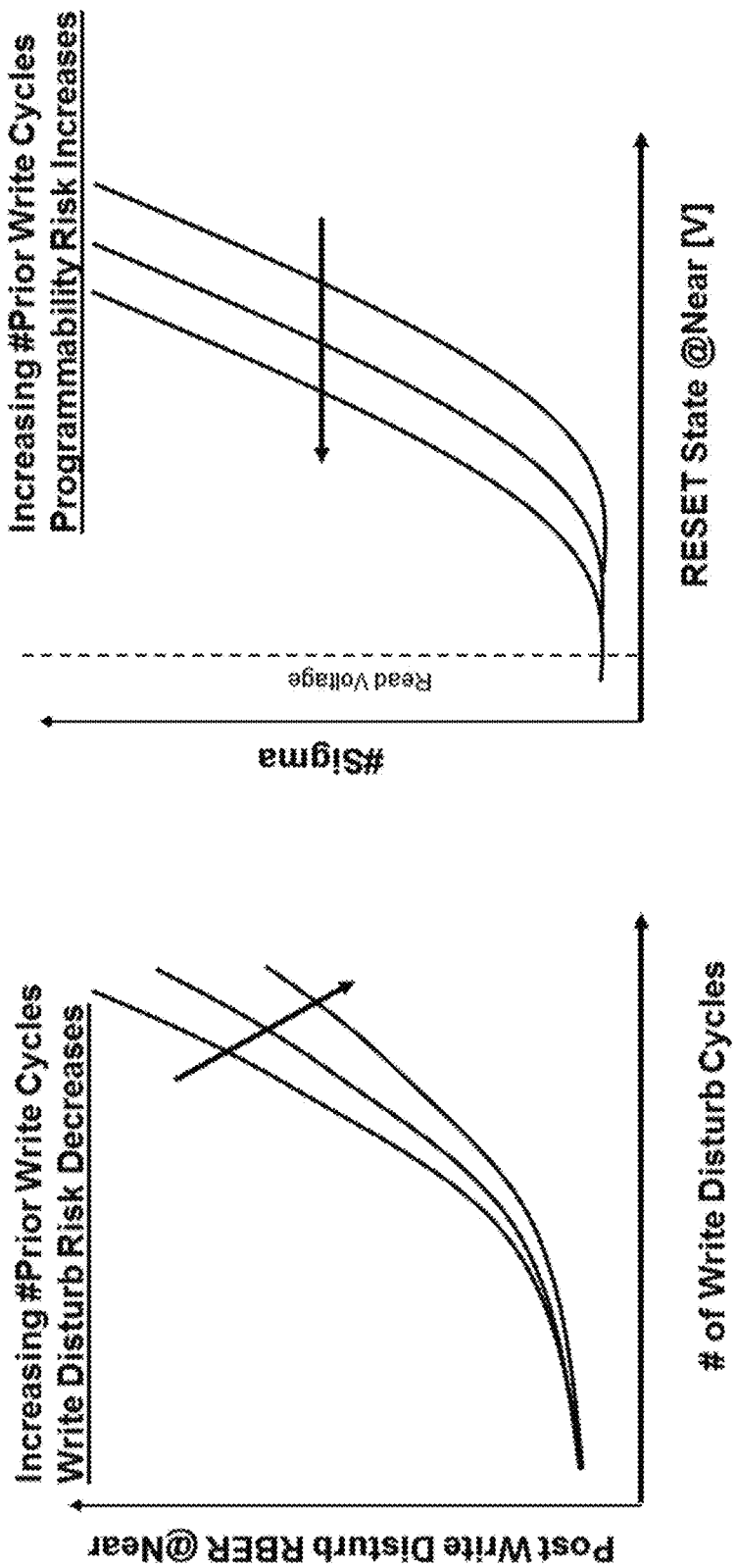
FIG. 5 illustrates a write disturb risk and a programmability risk trade-off with respect to a number of prior write cycles in accordance with an example embodiment.

FIG. 5 illustrates an example of a write disturb risk and a programmability risk trade-off with respect to a number of prior write cycles. As shown, the write disturb risk can decrease with an increasing number of prior write cycles for near memory cells, and the programmability risk can increase with an increasing number of prior write cycles for near memory cells. With an increasing number of prior write cycles, the write disturb risk can improve while the programmability risk (i.e., a reset programmability/margin) degrades. Thus, an optimum transient timing offset can change with an increasing number of prior write cycles. Therefore, in the present technology, variable or adjustable transition timings can be determined for signals corresponding to path resistance, supply bias and current mirror (i.e., transient timing optimizations) based on the number of prior write cycles.

Figure 6:
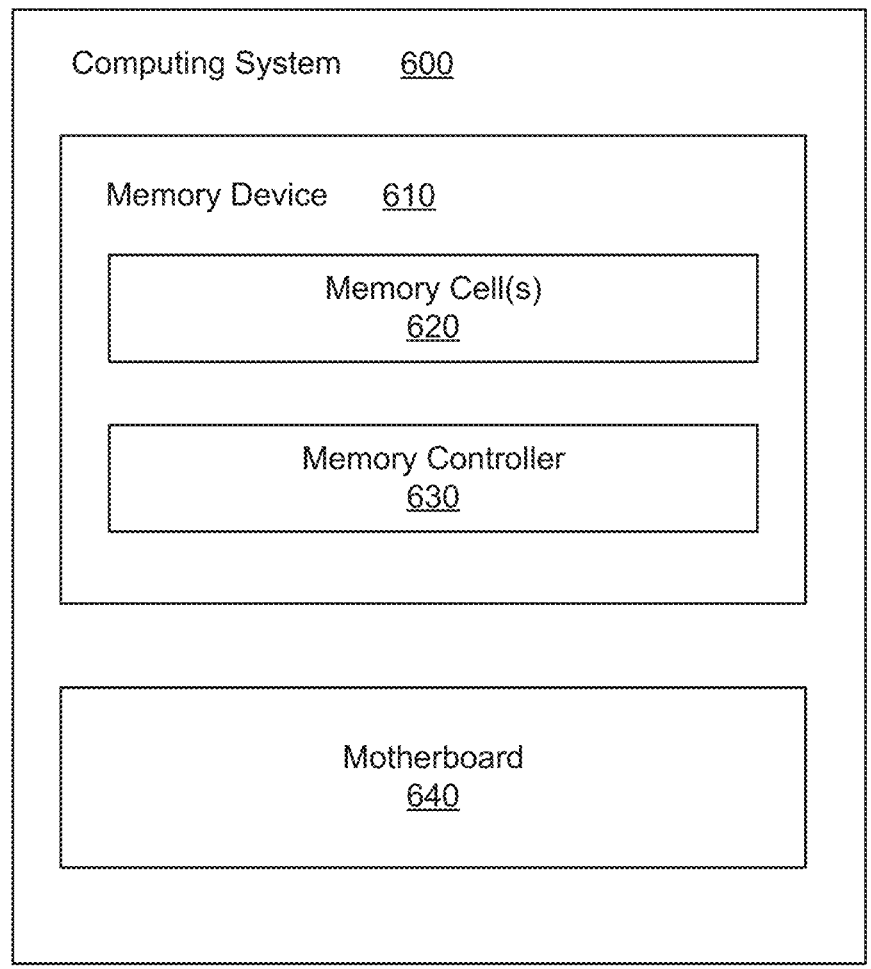
FIG. 6 illustrates a computing system that includes a memory device in accordance with an example embodiment.

FIG. 6 illustrates a computing system 600. The computing system 600 can include a memory device 610 and a motherboard 640. The memory device 610 can include an array of memory cell(s) 620 and a memory controller 630. The memory controller 630 can include logic to receive a request to program a memory cell 620 within the array of memory cells 620. The memory controller 630 can include logic to select one or more timing offsets for a programming pulse based on one or more of a polarity of access for the memory cell 620, a number of prior write cycles for the memory cell 620, or electrical distances between the memory cell 620 and wordline/bitline decoders within the array of memory cells 620. The memory controller 630 can include logic to initiate, in response to the request, the programming pulse with the one or more selected timing offset to program the memory cell 620 within the array of memory cells 620.

Figure 7:
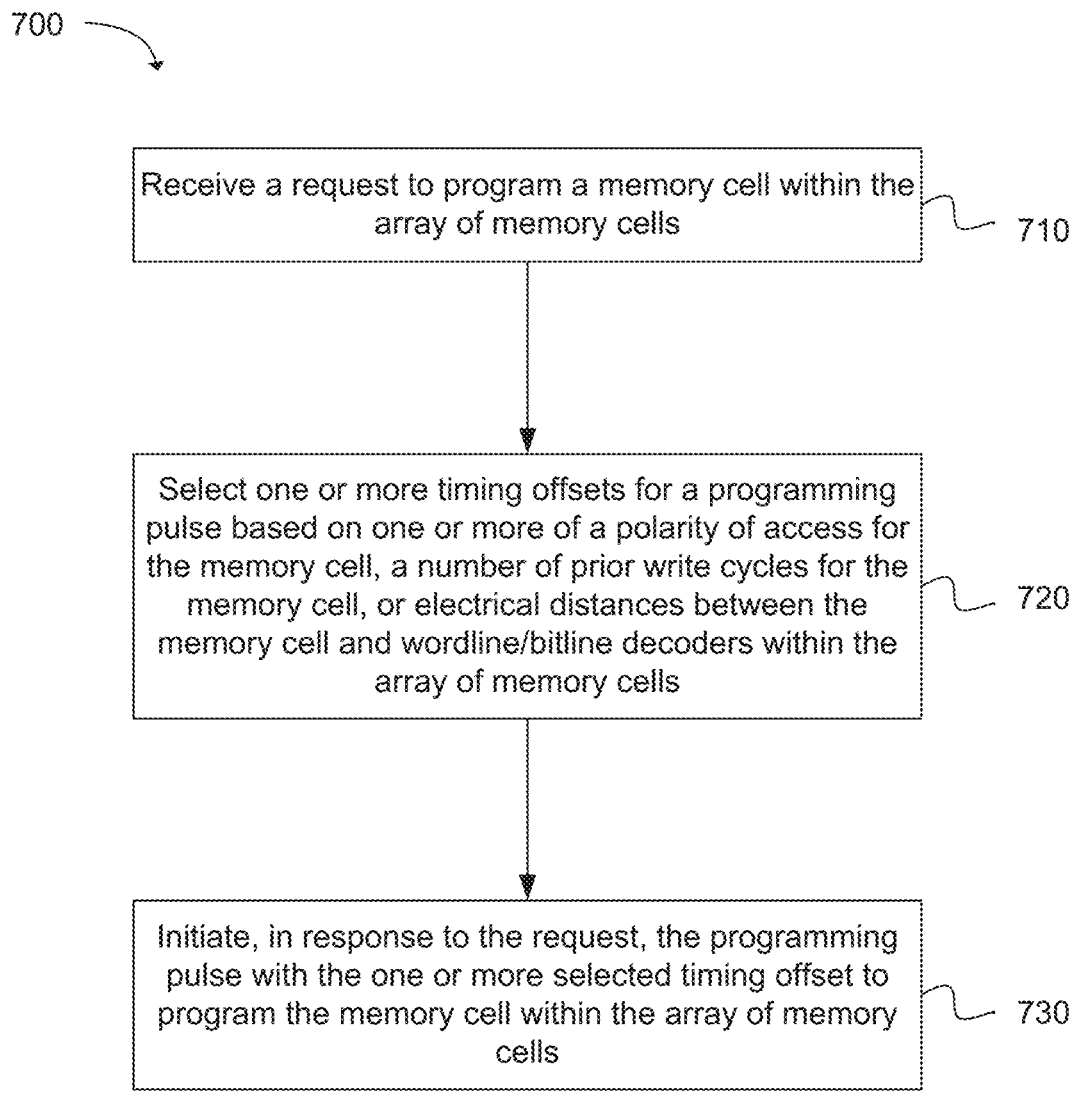
FIG. 7 is a flowchart illustrating operations for initiating a programming pulse to program a memory cell in a memory device in accordance with an example embodiment.

Another example provides a method 700 for initiating a programming pulse to program a memory cell in a memory device, as shown in the flow chart in FIG. 7. The method can be executed as instructions on a machine, where the instructions are included on at least one computer readable medium or one non-transitory machine readable storage medium. The method can include the operation of receiving, at a memory controller in the memory device, a request to program a memory cell within an array of memory cells in the memory device, as in block 710. The method can include the operation of selecting, at the memory controller, one or more timing offsets for a programming pulse based on one or more of a polarity of access for the memory cell, a number of prior write cycles for the memory cell, or electrical distances between the memory cell and wordline/bitline decoders within the array of memory cells, as in block 720. The method can include the operation of initiating, at the memory controller, in response to the request, the programming pulse with the one or more selected timing offset to program the memory cell within the array of memory cells, as in block 730.

Figure 8:
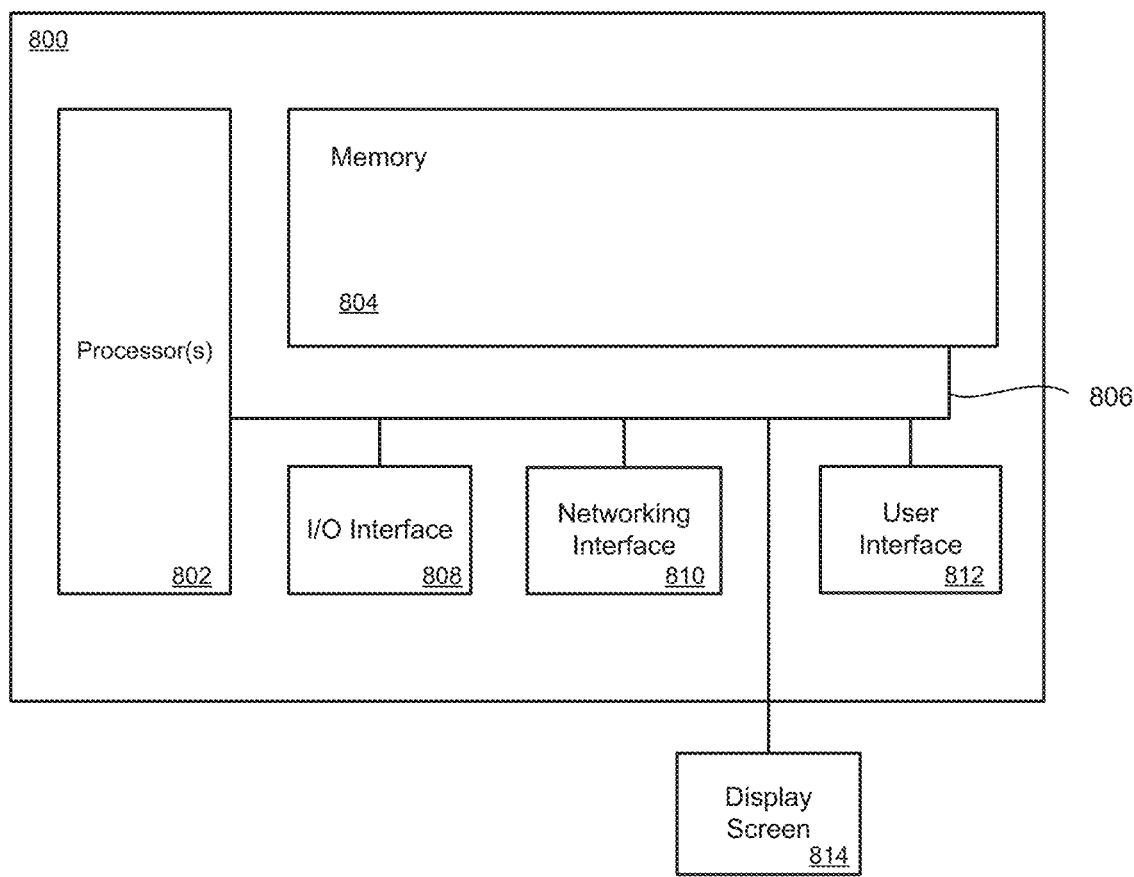
FIG. 8 illustrates a computing system that includes a data storage device in accordance with an example embodiment.

FIG. 8 illustrates a general computing system 800 that can be employed in the present technology. The computing system 800 can include a processor 802 in communication with a memory 804. The memory 804 can include any device, combination of devices, circuitry, and the like that is capable of storing, accessing, organizing, and/or retrieving data. Non-limiting examples include SANs (Storage Area Network), cloud storage networks, data storage servers, volatile or non-volatile RAM, phase change memory, optical media, hard-drive type media, and the like, including combinations thereof.

The computing system 800 additionally includes a local communication interface 806 for connectivity between the various components of the system. For example, the local communication interface 806 can be a local data bus and/or any related address or control busses as may be desired.

The computing system 800 can also include an I/O (input/output) interface 808 for controlling the I/O functions of the system, as well as for I/O connectivity to devices outside of the computing system 800. A network interface 810 can also be included for network connectivity. The network interface 810 can control network communications both within the system and outside of the system. The network interface can include a wired interface, a wireless interface, a Bluetooth interface, optical interface, and the like, including appropriate combinations thereof. Furthermore, the computing system 800 can additionally include a user interface 812, a display device 814, as well as various other components that would be beneficial for such a system.

The processor 802 can be a single or multiple processors, and the memory 804 can be a single or multiple memories. The local communication interface 806 can be used as a pathway to facilitate communication between any of a single processor, multiple processors, a single memory, multiple memories, the various interfaces, and the like, in any useful combination.

Various techniques, or certain aspects or portions thereof, can take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, optical drive, magnetic hard drive, solid state drive, or other medium for storing electronic data. The node and wireless device can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations. Exemplary systems or devices can include without limitation, laptop computers, tablet computers, desktop computers, smart phones, computer terminals and servers, storage databases, cloud storage servers, networks, and systems, and other electronics which utilize circuitry and programmable memory, such as household appliances, smart televisions, digital video disc (DVD) players, heating, ventilating, and air conditioning (HVAC) controllers, light switches, and the like.

EXAMPLES

The following examples pertain to specific invention embodiments and point out specific features, elements, or steps that can be used or otherwise combined in achieving such embodiments.

In one example, there is provided a memory device. The memory device can include an array of memory cells and a memory controller. The memory controller can comprise logic to: receive a request to program a memory cell within the array of memory cells; select one or more timing offsets for a programming pulse based on one or more of a polarity of access for the memory cell, a number of prior write cycles for the memory cell, or electrical distances between the memory cell and wordline/bitline decoders within the array of memory cells; and initiate, in response to the request, the programming pulse with the one or more selected timing offset to program the memory cell within the array of memory cells.

In one example of the memory device, the memory controller can further comprise logic to select the one or more timing offsets between multiple signals of the programming pulse, wherein the multiple signals of the programming pulse include a first signal that corresponds to a path resistance for the memory cell transitioning from high to low, a second signal that corresponds to a voltage bias that is supplied to the memory cell transitioning from low to high, and a third signal that corresponds to a current mirror transitioning from off to on.

In one example of the memory device, the one or more timing offsets includes a first timing offset between the first signal that corresponds to the path resistance and the second signal that corresponds to the voltage bias, and a second timing offset between the second signal that corresponds to the voltage bias and the third signal that corresponds to the current mirror.

In one example of the memory device, the second timing offset is equal to zero when the second signal and the third signal occur at a same time.

In one example of the memory device, the one or more timing offsets includes a first timing offset between the second signal that corresponds to the voltage bias and the first signal that corresponds to the path resistance, and a second timing offset between the first signal that corresponds to the path resistance and the third signal that corresponds to the current mirror.

In one example of the memory device, the second timing offset is equal to zero when the first signal and the third signal occur at a same time.

In one example of the memory device, the one or more timing offsets are equal to zero when the first signal, the second signal and the third signal occur at a same time.

In one example of the memory device, the memory controller can further comprise logic to: determine the polarity of access for the memory cell to be positive when a memory address of the memory cell is associated with a positive polarity deck; determine the polarity of access for the memory cell to be negative when the memory address of the memory cell is associated with a negative polarity deck; and select the one or more timing offsets for the programming pulse in accordance with the polarity of access being positive or the polarity of access being negative.

In one example of the memory device, the memory controller can further comprise logic to select decreased timing offsets for the programming pulse when the polarity of access for the memory cell is negative and increased timing offsets when the polarity of access for the memory cell is positive.

In one example of the memory device, the memory controller can further comprise logic to: determine the number of prior write cycles for the memory cell; and select increased timing offsets or decreased timing offsets for the programming pulse depending on the number of prior write cycles for the memory cell.

In one example of the memory device, the memory controller can further comprise logic to: determine the number of prior write cycles for the memory cell; select decreased timing offsets for the programming pulse when the number of prior write cycles for the memory cell is increased; and select increased timing offsets for the programming pulse when the number of prior write cycles for the memory cell is decreased.

In one example of the memory device, the memory controller can further comprise logic to: determine the electrical distances between the memory cell and the wordline/bitline decoders within the array of memory cells; and select the one or more timing offsets for the programming pulse in accordance with the electrical distances between the memory cell and the wordline/bitline decoders being less than a defined threshold or greater than a defined threshold, wherein the memory cell is a near memory cell when the electrical distances are less than the defined threshold, or the memory cell is a far memory cell when the electrical distances are greater than the defined threshold.

In one example of the memory device, the memory controller can further comprise logic to: select increased timing offsets for the programming pulse when the electrical distances between the memory cell and the wordline/bitline decoders are less than the defined threshold, indicating that the memory cell is located relatively near from the wordline/bitline decoders; or select decreased timing offsets for the programming pulse when the electrical distances between the memory cell and the wordline/bitline decoders are greater than the defined threshold, indicating that the memory cell is located relatively far from the wordline/bitline decoders.

In one example of the memory device, the one or more timing offsets for the programming pulse are variable transition timing offsets that are adjusted based on the polarity of access for the memory cell, the number of prior write cycles for the memory cell, and the electrical distances between the memory cell and wordline/bitline decoders within the array of memory cells.

In one example of the memory device, the memory controller can further comprise logic to reduce a likelihood of program disturbs and reduce a programmability risk in multiple regions of the array of memory cells by selecting optimized timing offsets for programming pulses based on the polarity of access, the number of prior write cycles and the electrical distances for the memory cells being programmed in the array of memory cells.

In one example, there is provided a computing system. The computing system can comprise a motherboard and a memory device coupled to the motherboard.

In one example of the computing system, the computing system comprises a desktop computer, a laptop, a tablet, a smartphone, a wearable device, a server, or a combination thereof.

In one example of the computing system, the computing system can further comprise a processor, a heat sink, a radio, a slot, a port, or a combination thereof operably coupled to the motherboard.

In one example, there is provided a controller configured to initiate a programming pulse to program a memory cell, The controller can comprise logic to: receive a request to program a memory cell within an array of memory cells in a memory device; select one or more timing offsets for a programming pulse based on one or more of a polarity of access for the memory cell, a number of prior write cycles for the memory cell, or electrical distances between the memory cell and wordline/bitline decoders within the array of memory cells; and initiate, in response to the request, the programming pulse with the one or more selected timing offset to program the memory cell within the array of memory cells.

In one example of the controller, the controller can further comprise logic to select the one or more timing offsets between multiple signals of the programming pulse, wherein the multiple signals of the programming pulse include a first signal that corresponds to a path resistance for the memory cell transitioning from high to low, a second signal that corresponds to a voltage bias that is supplied to the memory cell transitioning from low to high, and a third signal that corresponds to a current mirror transitioning from off to on.

In one example of the controller, the controller can further comprise logic to: determine the polarity of access for the memory cell to be positive when a memory address of the memory cell is associated with a positive polarity deck; determine the polarity of access for the memory cell to be negative when the memory address of the memory cell is associated with a negative polarity deck; and select the one or more timing offsets for the programming pulse in accordance with the polarity of access being positive or the polarity of access being negative.

In one example of the controller, the controller can further comprise logic to select decreased timing offsets for the programming pulse when the polarity of access for the memory cell is negative and increased timing offsets when the polarity of access for the memory cell is positive In one example of the controller, the controller can further comprise logic to: determine the number of prior write cycles for the memory cell; and select increased timing offsets or decreased timing offsets for the programming pulse depending on the number of prior write cycles for the memory cell.

In one example of the controller, the controller can further comprise logic to: determine the number of prior write cycles for the memory cell; select decreased timing offsets for the programming pulse when the number of prior write cycles for the memory cell is increased; and select increased timing offsets for the programming pulse when the number of prior write cycles for the memory cell is decreased.

In one example of the controller, the controller can further comprise logic to: determine the electrical distances between the memory cell and the wordline/bitline decoders within the array of memory cells; and select the one or more timing offsets for the programming pulse in accordance with the electrical distances between the memory cell and the wordline/bitline decoders being less than a defined threshold or greater than a defined threshold, wherein the memory cell is a near memory cell when the electrical distances are less than the defined threshold, or the memory cell is a far memory cell when the electrical distances are greater than the defined threshold.

In one example of the controller, the controller can further comprise logic to: select increased timing offsets for the programming pulse when the electrical distances between the memory cell and the wordline/bitline decoders are less than the defined threshold, indicating that the memory cell is located relatively near from the wordline/bitline decoders; or select decreased timing offsets for the programming pulse when the electrical distances between the memory cell and the wordline/bitline decoders are greater than the defined threshold, indicating that the memory cell is located relatively far from the wordline/bitline decoders.

In one example of the controller, the one or more timing offsets for the programming pulse are variable transition timing offsets that are adjusted based on the polarity of access for the memory cell, the number of prior write cycles for the memory cell, and the electrical distances between the memory cell and wordline/bitline decoders within the array of memory cells.

In one example of the controller, the controller can further comprise logic to reduce a likelihood of program disturbs and reduce a programmability risk in multiple regions of the array of memory cells by selecting optimized timing offsets for programming pulses based on the polarity of access, the number of prior write cycles and the electrical distances for the memory cells being programmed in the array of memory cells.

In one example, there is provided a method of making a memory device operable to initiate a programming pulse to program a memory cell in the memory device. The method can comprise the operations of: providing the memory device that includes an array of memory cells and a controller; and configuring the controller in the memory device with logic to: receive a request to program the memory cell within the array of memory cells; select one or more timing offsets for a programming pulse based on one or more of a polarity of access for the memory cell, a number of prior write cycles for the memory cell, or electrical distances between the memory cell and wordline/bitline decoders within the array of memory cells; and initiate, in response to the request, the programming pulse with the one or more selected timing offset to program the memory cell within the array of memory cells.

In one example of the method of making the memory device, one or more timing offsets are between multiple signals of the programming pulse, wherein the multiple signals of the programming pulse include a first signal that corresponds to a path resistance for the memory cell transitioning from high to low, a second signal that corresponds to a voltage bias that is supplied to the memory cell transitioning from low to high, and a third signal that corresponds to a current mirror transitioning from off to on.

In one example of the method of making the memory device, the one or more timing offsets for the programming pulse are variable transition timing offsets that are adjusted based on the polarity of access for the memory cell, the number of prior write cycles for the memory cell, and the electrical distances between the memory cell and wordline/bitline decoders within the array of memory cells.

In one example, there is provided a method for initiating a programming pulse to program a memory cell in a memory device. The method can include the operations of: receiving, at a memory controller in the memory device, a request to program a memory cell within an array of memory cells in the memory device; selecting, at the memory controller, one or more timing offsets for a programming pulse based on one or more of a polarity of access for the memory cell, a number of prior write cycles for the memory cell, or electrical distances between the memory cell and wordline/bitline decoders within the array of memory cells; and initiating, at the memory controller, in response to the request, the programming pulse with the one or more selected timing offset to program the memory cell within the array of memory cells.

In one example of the method for initiating the programming pulse to program the memory cell in the memory device, the method can further include selecting the one or more timing offsets between multiple signals of the programming pulse, wherein the multiple signals of the programming pulse include a first signal that corresponds to a path resistance for the memory cell transitioning from high to low, a second signal that corresponds to a voltage bias that is supplied to the memory cell transitioning from low to high, and a third signal that corresponds to a current mirror transitioning from off to on.

In one example of the method for initiating the programming pulse to program the memory cell in the memory device, the method can further include: determining the polarity of access for the memory cell to be positive when a memory address of the memory cell is associated with a positive polarity deck; determining the polarity of access for the memory cell to be negative when the memory address of the memory cell is associated with a negative polarity deck; and selecting the one or more timing offsets for the programming pulse in accordance with the polarity of access being positive or the polarity of access being negative.

In one example of the method for initiating the programming pulse to program the memory cell in the memory device, the method can further include selecting decreased timing offsets for the programming pulse when the polarity of access for the memory cell is negative and increased timing offsets when the polarity of access for the memory cell is positive.

In one example of the method for initiating the programming pulse to program the memory cell in the memory device, the method can further include: determining the number of prior write cycles for the memory cell; and selecting increased timing offsets or decreased timing offsets for the programming pulse depending on the number of prior write cycles for the memory cell.

In one example of the method for initiating the programming pulse to program the memory cell in the memory device, the method can further include: determining the number of prior write cycles for the memory cell; selecting decreased timing offsets for the programming pulse when the number of prior write cycles for the memory cell is increased; and selecting increased timing offsets for the programming pulse when the number of prior write cycles for the memory cell is decreased.

In one example of the method for initiating the programming pulse to program the memory cell in the memory device, the method can further include: determining the electrical distances between the memory cell and the wordline/bitline decoders within the array of memory cells; and selecting the one or more timing offsets for the programming pulse in accordance with the electrical distances between the memory cell and the wordline/bitline decoders being less than a defined threshold or greater than a defined threshold, wherein the memory cell is a near memory cell when the electrical distances are less than the defined threshold, or the memory cell is a far memory cell when the electrical distances are greater than the defined threshold.

In one example of the method for initiating the programming pulse to program the memory cell in the memory device, the method can further include: selecting increased timing offsets for the programming pulse when the electrical distances between the memory cell and the wordline/bitline decoders are less than the defined threshold, indicating that the memory cell is located relatively near from the wordline/bitline decoders; or selecting decreased timing offsets for the programming pulse when the electrical distances between the memory cell and the wordline/bitline decoders are greater than the defined threshold, indicating that the memory cell is located relatively far from the wordline/bitline decoders.

In one example of the method for initiating the programming pulse to program the memory cell in the memory device, the one or more timing offsets for the programming pulse are variable transition timing offsets that are adjusted based on the polarity of access for the memory cell, the number of prior write cycles for the memory cell, and the electrical distances between the memory cell and wordline/bitline decoders within the array of memory cells.

In one example of the method for initiating the programming pulse to program the memory cell in the memory device, the method can further include reducing a likelihood of program disturbs and reduce a programmability risk in multiple regions of the array of memory cells by selecting optimized timing offsets for programming pulses based on the polarity of access, the number of prior write cycles and the electrical distances for the memory cells being programmed in the array of memory cells.

In one example, there is provided at least one non-transitory machine readable storage medium having instructions embodied thereon for initiating a programming pulse to program a memory cell in a memory device. The instructions when executed by a memory controller in the memory device perform the following: receiving, at the memory controller in the memory device, a request to program a memory cell within an array of memory cells in the memory device; selecting, at the memory controller, one or more timing offsets for a programming pulse based on one or more of a polarity of access for the memory cell, a number of prior write cycles for the memory cell, or electrical distances between the memory cell and wordline/bitline decoders within the array of memory cells; and initiating, at the memory controller, in response to the request, the programming pulse with the one or more selected timing offset to program the memory cell within the array of memory cells.

In one example of the at least one non-transitory machine readable storage medium, the at least one non-transitory machine readable storage medium further comprises instructions when executed perform the following: selecting the one or more timing offsets between multiple signals of the programming pulse, wherein the multiple signals of the programming pulse include a first signal that corresponds to a path resistance for the memory cell transitioning from high to low, a second signal that corresponds to a voltage bias that is supplied to the memory cell transitioning from low to high, and a third signal that corresponds to a current mirror transitioning from off to on.

In one example of the at least one non-transitory machine readable storage medium, the at least one non-transitory machine readable storage medium further comprises instructions when executed perform the following: determining the polarity of access for the memory cell to be positive when a memory address of the memory cell is associated with a positive polarity deck; determining the polarity of access for the memory cell to be negative when the memory address of the memory cell is associated with a negative polarity deck; and selecting the one or more timing offsets for the programming pulse in accordance with the polarity of access being positive or the polarity of access being negative.

In one example of the at least one non-transitory machine readable storage medium, the at least one non-transitory machine readable storage medium further comprises instructions when executed perform the following: selecting decreased timing offsets for the programming pulse when the polarity of access for the memory cell is negative and increased timing offsets when the polarity of access for the memory cell is positive.

In one example of the at least one non-transitory machine readable storage medium, the at least one non-transitory machine readable storage medium further comprises instructions when executed perform the following: determining the number of prior write cycles for the memory cell; and selecting increased timing offsets or decreased timing offsets for the programming pulse depending on the number of prior write cycles for the memory cell.

In one example of the at least one non-transitory machine readable storage medium, the at least one non-transitory machine readable storage medium further comprises instructions when executed perform the following: determining the number of prior write cycles for the memory cell; selecting decreased timing offsets for the programming pulse when the number of prior write cycles for the memory cell is increased; and selecting increased timing offsets for the programming pulse when the number of prior write cycles for the memory cell is decreased.

In one example of the at least one non-transitory machine readable storage medium, the at least one non-transitory machine readable storage medium further comprises instructions when executed perform the following: determining the electrical distances between the memory cell and the wordline/bitline decoders within the array of memory cells; and selecting the one or more timing offsets for the programming pulse in accordance with the electrical distances between the memory cell and the wordline/bitline decoders being less than a defined threshold or greater than a defined threshold, wherein the memory cell is a near memory cell when the electrical distances are less than the defined threshold, or the memory cell is a far memory cell when the electrical distances are greater than the defined threshold.

In one example of the at least one non-transitory machine readable storage medium, the at least one non-transitory machine readable storage medium further comprises instructions when executed perform the following: selecting increased timing offsets for the programming pulse when the electrical distances between the memory cell and the wordline/bitline decoders are less than the defined threshold, indicating that the memory cell is located relatively near from the wordline/bitline decoders; or selecting decreased timing offsets for the programming pulse when the electrical distances between the memory cell and the wordline/bitline decoders are greater than the defined threshold, indicating that the memory cell is located relatively far from the wordline/bitline decoders.

In one example of the at least one non-transitory machine readable storage medium, the one or more timing offsets for the programming pulse are variable transition timing offsets that are adjusted based on the polarity of access for the memory cell, the number of prior write cycles for the memory cell, and the electrical distances between the memory cell and wordline/bitline decoders within the array of memory cells.

In one example of the at least one non-transitory machine readable storage medium, the at least one non-transitory machine readable storage medium further comprises instructions when executed perform the following: reducing a likelihood of program disturbs and reduce a programmability risk in multiple regions of the array of memory cells by selecting optimized timing offsets for programming pulses based on the polarity of access, the number of prior write cycles and the electrical distances for the memory cells being programmed in the array of memory cells.

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A memory device, comprising:
an array of memory cells; and
a memory controller comprising logic to:
receive a request to program a memory cell within the array of memory cells;
select one or more timing offsets for a programming pulse based on one or more of a polarity of access for the memory cell, a number of prior write cycles for the memory cell, or electrical distances between the memory cell and wordline/bitline decoders within the array of memory cells; and
initiate, in response to the request, the programming pulse with the one or more selected timing offsets to program the memory cell within the array of memory cells.

2. The memory device of claim 1, wherein the memory controller further comprises logic to select the one or more timing offsets between multiple signals of the programming pulse, wherein the multiple signals of the programming pulse include a first signal that corresponds to a path resistance for the memory cell transitioning from high to low, a second signal that corresponds to a voltage bias that is supplied to the memory cell transitioning from low to high, and a third signal that corresponds to a current mirror transitioning from off to on.

3. The memory device of claim 2, wherein the one or more timing offsets includes a first timing offset between the first signal that corresponds to the path resistance and the second signal that corresponds to the voltage bias, and a second timing offset between the second signal that corresponds to the voltage bias and the third signal that corresponds to the current mirror.

4. The memory device of claim 3, wherein the second timing offset is equal to zero when the second signal and the third signal occur at a same time.

5. The memory device of claim 2, wherein the one or more timing offsets includes a first timing offset between the second signal that corresponds to the voltage bias and the first signal that corresponds to the path resistance, and a second timing offset between the first signal that corresponds to the path resistance and the third signal that corresponds to the current mirror.

6. The memory device of claim 5, wherein the second timing offset is equal to zero when the first signal and the third signal occur at a same time.

7. The memory device of claim 2, wherein the one or more timing offsets are equal to zero when the first signal, the second signal and the third signal occur at a same time.

8. The memory device of claim 1, wherein the memory controller further comprises logic to:
determine the polarity of access for the memory cell to be positive when a memory address of the memory cell is associated with a positive polarity deck;
determine the polarity of access for the memory cell to be negative when the memory address of the memory cell is associated with a negative polarity deck; and
select the one or more timing offsets for the programming pulse in accordance with the polarity of access being positive or the polarity of access being negative.

9. The memory device of claim 8, wherein the memory controller further comprises logic to select decreased timing offsets for the programming pulse when the polarity of access for the memory cell is negative and increased timing offsets when the polarity of access for the memory cell is positive.

10. The memory device of claim 1, wherein the memory controller further comprises logic to:
determine the number of prior write cycles for the memory cell; and
select increased timing offsets or decreased timing offsets for the programming pulse depending on the number of prior write cycles for the memory cell.

11. The memory device of claim 1, wherein the memory controller further comprises logic to:
determine the number of prior write cycles for the memory cell;
select decreased timing offsets for the programming pulse when the number of prior write cycles for the memory cell is increased; and
select increased timing offsets for the programming pulse when the number of prior write cycles for the memory cell is decreased.

12. The memory device of claim 1, wherein the memory controller further comprises logic to:
determine the electrical distances between the memory cell and the wordline/bitline decoders within the array of memory cells; and
select the one or more timing offsets for the programming pulse in accordance with the electrical distances between the memory cell and the wordline/bitline decoders being less than a defined threshold or greater than a defined threshold,
wherein the memory cell is a near memory cell when the electrical distances are less than the defined threshold, or the memory cell is a far memory cell when the electrical distances are greater than the defined threshold.

13. The memory device of claim 12, wherein the memory controller further comprises logic to:
select increased timing offsets for the programming pulse when the electrical distances between the memory cell and the wordline/bitline decoders are less than the defined threshold, indicating that the memory cell is located relatively near from the wordline/bitline decoders; or select decreased timing offsets for the programming pulse when the electrical distances between the memory cell and the wordline/bitline decoders are greater than the defined threshold, indicating that the memory cell is located relatively far from the wordline/bitline decoders.

14. The memory device of claim 1, wherein the one or more timing offsets for the programming pulse are variable transition timing offsets that are adjusted based on the polarity of access for the memory cell, the number of prior write cycles for the memory cell, and the electrical distances between the memory cell and wordline/bitline decoders within the array of memory cells.

15. The memory device of claim 1, wherein the memory controller further comprises logic to reduce a likelihood of program disturbs and reduce a programmability risk in multiple regions of the array of memory cells by selecting optimized timing offsets for programming pulses based on the polarity of access, the number of prior write cycles and the electrical distances for the memory cells being programmed in the array of memory cells.

16. A controller configured to initiate a programming pulse to program a memory cell, the controller comprising logic to:
receive a request to program a memory cell within an array of memory cells in a memory device;
select one or more timing offsets for a programming pulse based on one or more of a polarity of access for the memory cell, a number of prior write cycles for the memory cell, or electrical distances between the memory cell and wordline/bitline decoders within the array of memory cells; and
initiate, in response to the request, the programming pulse with the one or more selected timing offsets to program the memory cell within the array of memory cells.

17. The controller of claim 16, further comprising logic to select the one or more timing offsets between multiple signals of the programming pulse, wherein the multiple signals of the programming pulse include a first signal that corresponds to a path resistance for the memory cell transitioning from high to low, a second signal that corresponds to a voltage bias that is supplied to the memory cell transitioning from low to high, and a third signal that corresponds to a current mirror transitioning from off to on.

18. The controller of claim 16, further comprising logic to:
determine the polarity of access for the memory cell to be positive when a memory address of the memory cell is associated with a positive polarity deck;
determine the polarity of access for the memory cell to be negative when the memory address of the memory cell is associated with a negative polarity deck; and
select the one or more timing offsets for the programming pulse in accordance with the polarity of access being positive or the polarity of access being negative.

19. The controller of claim 18, further comprising logic to select decreased timing offsets for the programming pulse when the polarity of access for the memory cell is negative and increased timing offsets when the polarity of access for the memory cell is positive.

20. The controller of claim 16, further comprising logic to:
determine the number of prior write cycles for the memory cell; and select increased timing offsets or decreased timing offsets for the programming pulse depending on the number of prior write cycles for the memory cell.

21. The controller of claim 16, further comprising logic to:
determine the number of prior write cycles for the memory cell;
select decreased timing offsets for the programming pulse when the number of prior write cycles for the memory cell is increased; and
select increased timing offsets for the programming pulse when the number of prior write cycles for the memory cell is decreased.

22. The controller of claim 16, further comprising logic to:
determine the electrical distances between the memory cell and the wordline/bitline decoders within the array of memory cells; and
select the one or more timing offsets for the programming pulse in accordance with the electrical distances between the memory cell and the wordline/bitline decoders being less than a defined threshold or greater than a defined threshold,
wherein the memory cell is a near memory cell when the electrical distances are less than the defined threshold, or the memory cell is a far memory cell when the electrical distances are greater than the defined threshold.

23. The controller of claim 22, further comprising logic to:
select increased timing offsets for the programming pulse when the electrical distances between the memory cell and the wordline/bitline decoders are less than the defined threshold, indicating that the memory cell is located relatively near from the wordline/bitline decoders; or
select decreased timing offsets for the programming pulse when the electrical distances between the memory cell and the wordline/bitline decoders are greater than the defined threshold, indicating that the memory cell is located relatively far from the wordline/bitline decoders.

24. The controller of claim 16, wherein the one or more timing offsets for the programming pulse are variable transition timing offsets that are adjusted based on the polarity of access for the memory cell, the number of prior write cycles for the memory cell, and the electrical distances between the memory cell and wordline/bitline decoders within the array of memory cells.

25. The controller of claim 16, further comprising logic to reduce a likelihood of program disturbs and reduce a programmability risk in multiple regions of the array of memory cells by selecting optimized timing offsets for programming pulses based on the polarity of access, the number of prior write cycles and the electrical distances for the memory cells being programmed in the array of memory cells.

26. A method of making a memory device operable to initiate a programming pulse to program a memory cell in the memory device, the method comprising:
providing the memory device that includes an array of memory cells and a controller; and
configuring the controller in the memory device with logic to:
receive a request to program the memory cell within the array of memory cells;

select one or more timing offsets for a programming pulse based on one or more of a polarity of access for the memory cell, a number of prior write cycles for the memory cell, or electrical distances between the memory cell and wordline/bitline decoders within the array of memory cells; and initiate, in response to the request, the programming pulse with the one or more selected timing offsets to program the memory cell within the array of memory cells.

27. The method of claim 26, wherein one or more timing offsets are between multiple signals of the programming pulse, wherein the multiple signals of the programming pulse include a first signal that corresponds to a path resistance for the memory cell transitioning from high to low, a second signal that corresponds to a voltage bias that is supplied to the memory cell transitioning from low to high, and a third signal that corresponds to a current mirror transitioning from off to on.

28. The method of claim 26, wherein the one or more timing offsets for the programming pulse are variable transition timing offsets that are adjusted based on the polarity of access for the memory cell, the number of prior write cycles for the memory cell, and the electrical distances between the memory cell and wordline/bitline decoders within the array of memory cells.

* * * * *